United States Patent [19]
Onoda

[11] Patent Number: 5,639,690
[45] Date of Patent: Jun. 17, 1997

[54] METHOD FOR MANUFACTURING A CONDUCTIVE PATTERN STRUCTURE FOR A SEMICONDUCTOR DEVICE

[75] Inventor: Hiroshi Onoda, Tokyo, Japan

[73] Assignee: Oki Electric Industry Co., Ltd., Tokyo, Japan

[21] Appl. No.: 471,205

[22] Filed: Jun. 6, 1995

Related U.S. Application Data

[62] Division of Ser. No. 113,665, Aug. 31, 1993, which is a continuation of Ser. No. 851,294, Mar. 12, 1992, abandoned.

[30] Foreign Application Priority Data

Mar. 12, 1991 [JP] Japan ........................... 3-70324

[51] Int. Cl.$^6$ ........................... H01L 21/44
[52] U.S. Cl. ................. 437/195; 437/194; 437/247; 437/192; 437/188
[58] Field of Search ..................... 437/195, 194, 437/192, 247, 188, 196, 197, 200; 148/DIG. 93

[56] References Cited

U.S. PATENT DOCUMENTS

| | | |
|---|---|---|
| 4,556,897 | 12/1985 | Yorikane et al. . |
| 4,847,674 | 7/1989 | Silwa et al. . |
| 4,849,363 | 7/1989 | Coffey et al. ............... 437/19 |
| 4,887,146 | 12/1989 | Hinode . |
| 4,897,709 | 1/1990 | Yokoyama et al. . |
| 4,898,840 | 2/1990 | Okuyama . |
| 4,910,580 | 3/1990 | Kuecher et al. . |
| 4,941,031 | 7/1990 | Kumagai et al. . |
| 4,974,048 | 11/1990 | Chakravorty et al. . |
| 4,985,750 | 1/1991 | Hoshino . |
| 5,049,975 | 9/1991 | Ajika et al. . |
| 5,070,392 | 12/1991 | Coffey et al. . |
| 5,300,756 | 4/1994 | Cordingley . |

OTHER PUBLICATIONS

"Standard Growth of Aluminum Using a Novel CVD System", T. Amazawa et al., NTT LSI Laboratories, 1988 IEEE, pp. 442–445.

*Primary Examiner*—John Niebling
*Assistant Examiner*—C. Everhart
*Attorney, Agent, or Firm*—Jones & Volentine

[57] ABSTRACT

A method is provided of fabricating a semiconductor device having a wiring layer of a desired resistance component and capable of eliminating variation of wiring resistance by causing breakage of an Al or Al alloy layer of a laminated structure at certain positions. The multilayer conductive patterns of the invention include a laminate of a low melting point conductive layer formed of at least aluminum and a high melting point conductive layer. The side surfaces of the low melting point conductive layer includes recessed portions located at spaced apart length intervals of the multilayer conductive patterns.

17 Claims, 3 Drawing Sheets

METHOD FOR MANUFACTURING A CONDUCTIVE PATTERN STRUCTURE FOR A SEMICONDUCTOR DEVICE

CROSS-REFERENCE TO RELATED APPLICATIONS

This is a Divisional of application Ser. No. 08/113,665, filed Aug. 31, 1993, which is a Continuation of abandoned application Ser. No. 07/851,294, filed Mar. 12, 1992.

BACKGROUND OF THE INVENTION

1. Field of the Invention

The present invention relates to a method of fabricating a semiconductor device such as a semiconductor LSI etc., particularly to the fabrication of a laminated wiring structure on the semiconductor device which is composed of an aluminum or aluminum alloy layer and a high melting point conductive layer.

2. Description of the Related Art

A single layer wiring structure formed of an Al, Al-Si alloy, Al-Si-CU alloy, etc. layer has been employed as a wiring for a semiconductor integrated circuit device.

In order to realize the production of a highly integrated semiconductor integrated circuit device, however, a laminated structure formed of an Al or Al alloy layer and a high melting point conductive layer (e.g., TiN, TiW, WNW, $WSi_2$ etc.) has recently been employed as a wiring layer. This is because the breakage of wire is liable to occur in the single layer wiring structure formed of an Al or Al alloy layer alone, due to stress-migration or electromigration during heat treatment as the wiring layer employs finer wiring and thinner films. A laminated wiring structure composed of an Al or Al alloy layer and a high melting point conductive layer can prevent failure of the whole semiconductor integrated circuit device, even if the Al or Al alloy layer is broken, since the high melting point conductive layer maintains its electric conductivity. However, if the Al or Al alloy wirings are broken at random positions, irregular variations between the wiring resistance components occur which affect the operating speed and operational timing of the internal circuits. As a result, the overall characteristics of the semiconductor integrated circuit device are deteriorated.

SUMMARY OF THE INVENTION

It is an object of the present invention to provide a method of fabricating a semiconductor device having a wiring layer of a predetermined resistance component and capable of eliminating the variation of wiring resistance inherent in the prior art by causing breakage of an Al or Al alloy layer of the laminated structure at predetermined positions.

The method of manufacturing a conductive pattern structure for a semiconductor device according to the present invention comprises the steps of providing a semiconductor substrate having a principal surface and forming a plurality of multilayer conductive patterns each having a length and a width which extend along and substantially parallel to the principal surface of the semiconductor substrate. Each of the multilayer conductive patterns includes a laminate of a low melting point conductive layer formed of at least aluminum and a high melting point conductive layer and each of the multilayer conductive patterns includes opposite side surfaces each extending substantially perpendicular to the principal surface of the semiconductor substrate. The opposite side surfaces of the low melting point conductive layer includes recessed portions located at spaced apart predetermined length intervals of the multilayer conductive patterns. The width of each of the high melting point conductive layer is decreased at each of the spaced apart predetermined length intervals and the length of the recessed portion of the high melting point conductive layer being less than 0.5 µm.

The method of manufacturing a conductive pattern structure for a semiconductor device according to the present invention further comprises the step of subjecting the multilayer conductive patterns to a heat treatment so that the low melting point conductive layer is broken at each recessed portions.

The semiconductor device fabricated according to the present invention includes a laminated wiring structure composed of an Al or Al alloy low melting point conductive layer and a high melting point conductive layer, and is characterized in that the Al or Al alloy wiring layer has narrowed portions at predetermined intervals at which the stress-resistance of the Al or Al alloy is reduced.

A predetermined wiring resistance component is obtained and a variation in wiring resistance component can be restrained by intentionally breaking the Al or Al alloy wirings layers at the narrowed portions.

DESCRIPTION OF THE PREFERRED EMBODIMENT

Figure 1A:
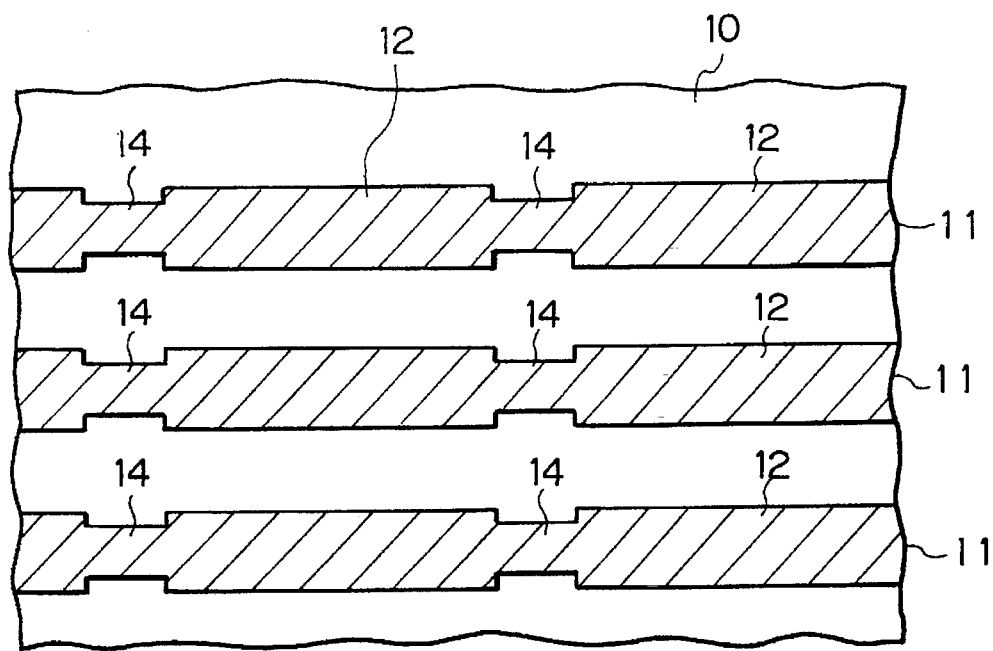
FIG. 1(a) is a plan view showing a laminated wiring structure body which is used in a semiconductor integrated circuit device according to a preferred embodiment of the present invention.
Figure 1B:
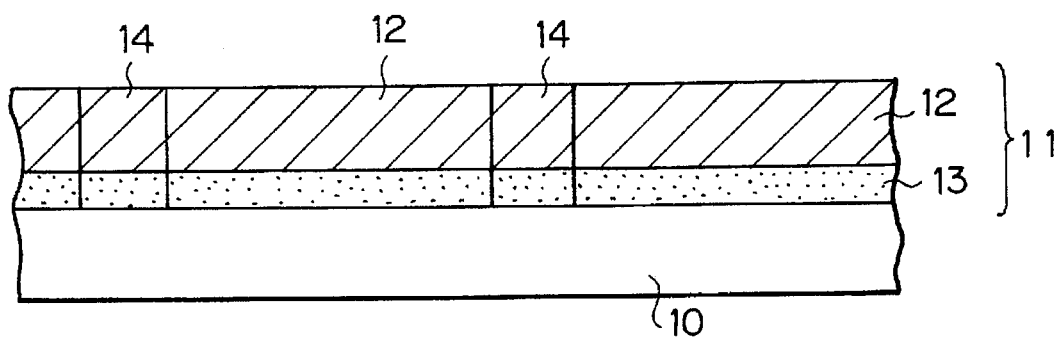
FIG. 1(b) is a cross-sectional view of the laminated wiring structure in FIG. 1(a)

A preferred embodiment of the present invention will be described with reference to FIGS. 1(a), 1(b) and 2, wherein FIG. 1(a) is a plan view and FIG. 1(b) is a cross-section view. A wiring 11 formed on a semiconductor substrate 10 includes an upper layer of a low melting point conductive layer, e.g., an Al layer 12, and a lower layer of a high melting point conductive layer, e.g., a TiN layer 13. For example, the Al layer is 4000 Å thick, and the TiN layer is 1000 Å thick. Their widths are, e.g., about 1 µm. The wiring has narrowed portions 14 at intervals ranging from 50 to 500 µm. The width of the narrowed portions is at the most about one half of that of the other portions. The narrowed portions 14 should be as short as possible, e.g., about 0.5 µm under current lithographic techniques. It is desirable that the width of the narrowed portions be made as short as possible together with improvements in lithographic techniques.

The narrowed portions of the Al layer are finally broken or electrically disconnected before the final wafer process is finished. The Al layer is sintered in hydrogen at a temperature of 350° to 400° C. after being subjected to patterning, and the wiring is broken at almost all the narrowed portions due to this heat treatment. The narrowed portions which were not broken in the foregoing processes are completely broken in the heat treatment (400° C. for about 30 min.) during the formation of a passivation film.

When the wiring 11 set forth above is used as the lowest layer wiring of a multi-layer wiring (e.g., 2-layer wiring), an insulating film is formed between the layers at the next step. When the wiring 11 is used as a single layer wiring or an uppermost layer wiring of the multi-layer wiring, a passivation film (last protective insulating film) is formed at the next step. When the wiring 11 is subjected to a heat treatment, e.g., at the time of forming the insulating film, the Al wiring layer is broken at its weak points since the coefficient of linear expansion of Al is 10 times greater than that of the base material such as Si, $SiO_2$, etc. This is because Al increases its volume largely to thereby generate a plastic deformation at high temperature during heat treatment and reduces its volume largely in cooling to thereby generate a heat stress in the Al wiring layers.

Figure 2:
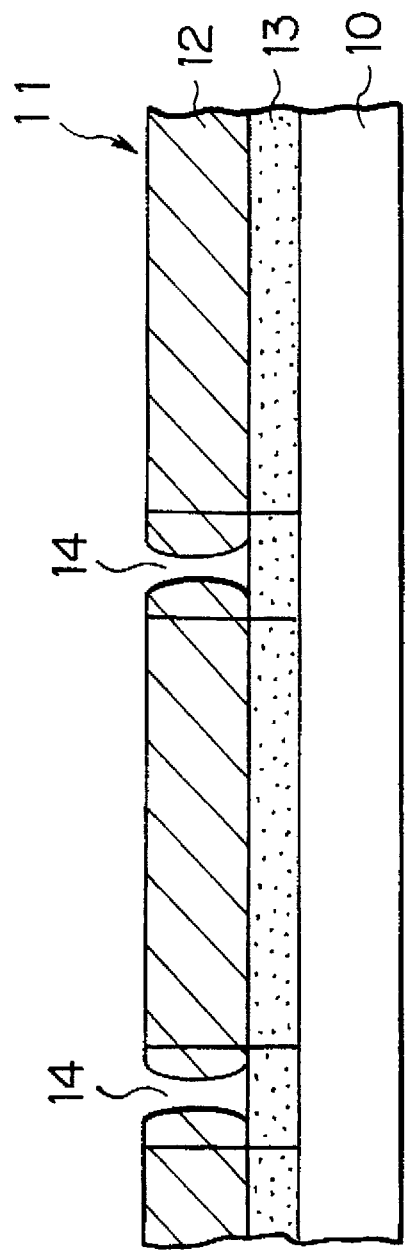
FIG. 2 is a cross-sectional view of the laminated wiring structure in FIG. 1(a) showing breaking of the wiring.

As described in the preferred embodiment, the Al wiring 12 is broken at the narrowed portions 14 which are formed at predetermined intervals as shown in FIG. 2. This is because the strength of the wiring is reduced at the narrowed portions 14. Consequently, the breakage of Al wiring 12 can be localized at weak narrowed portions 14 so as to control the breaking points of the Al wiring 12. Furthermore, inasmuch as the breaking of the wiring at the narrowed portions 14 releases the stress of the wiring, the unintentional breakage of the Al wiring 12 caused by stress- or electro-migration can be restrained so as to always attain a uniform wiring resistance location of a component.

Figure 3:
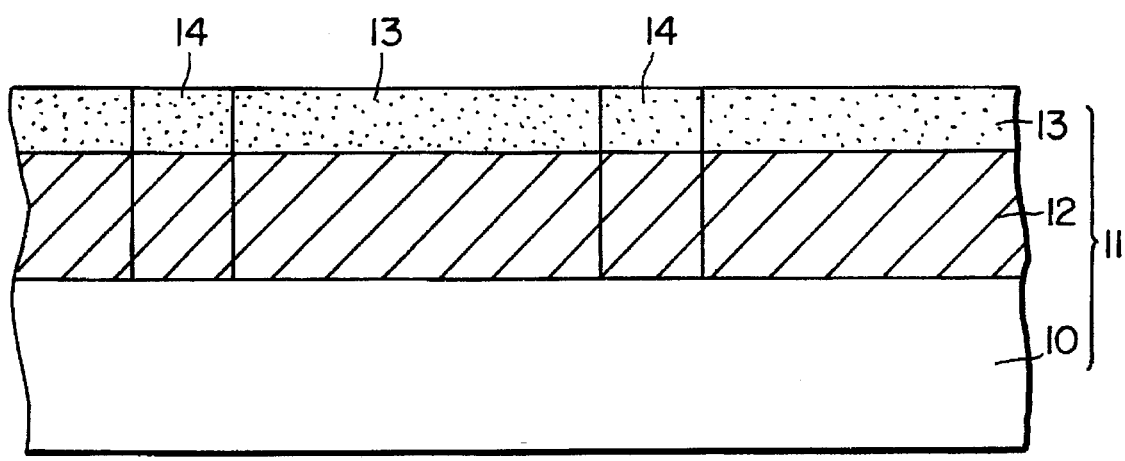
FIG. 3 is also a cross-sectional view of the laminated wiring structure in FIG. 1(a), except the low melting temperature conductive layer comprising Al is located directly on the semiconductor and the high melting point conductive layer is located on top of the low melting point conductive layer.

FIG. 3 is similar to FIG. 1(b), except that the low melting point conductive layer 12 and the high temperature melting point layer 13 are reversed as indicated therein.

Supposing that the specific resistance factors Al 12 and TiN 13 are 3 $\mu\Omega\cdot cm$ and 100 $\mu\Omega\cdot cm$, respectively, and the broken gap of the Al wiring is 1 $\mu m$ in the case of the laminate wiring of Al/TiN, according to the preferred embodiment, the resistance component increasing rate per each breaking of Al wiring 12 is about 1.5% per each wire of 1 cm length. It is about 1% if the Al wiring 12 is 3000 Å thick and about 2% if the Al wiring 12 is 6000 Å thick. The increase of the resistance component caused by the wiring breakage can be estimated so that it is possible to design a circuit by incorporating variations in circuit parameters.

Although TiN was employed as the lower layer of the high melting point conductive layer in the preferred embodiment, other high melting point materials such as TiW, WN, W, $WSi_2$, $MoSi_2$, etc. can be employed too. The upper Al layer can be substituted by an Al-Si alloy, an Al-Si-Cu alloy, an Al-Si-Cu-Hf-B alloy, Al-Ti, Al-Pd, Al-Pd-Nb, Al-Sc, Al-Cr-Cu-, Al-Cr, Al-Ti-Cu or the like, instead of pure Al. The present invention can be applied to other laminated wiring structures such as those having a high melting point conductive layer on the upper surface of an Al layer, those having high melting point conductive layers on the upper and lower surfaces of the Al layer and those having high melting point conductive layers interlaced with a plurality of Al layers.

What is claimed is:

1. A method of manufacturing a conductive pattern structure for a semiconductor device comprising the steps of:

providing a semiconductor substrate having a principal surface;

forming a plurality of multilayer conductive patterns each having a length and a width which extend along and substantially parallel to the principal surface of the semiconductor substrate, each of the multilayer conductive patterns including a laminate of a low melting point conductive layer formed of at least aluminum and a high melting point conductive layer, each of the multilayer conductive patterns including opposite side surfaces each extending substantially perpendicular to the principal surface of the semiconductor substrate, the opposite side surfaces of the low melting point conductive layer including recessed portions located at spaced apart length intervals of the multilayer conductive patterns wherein the width of the low melting point conductive layer is decreased at each of the spaced apart length intervals; and subjecting the entirety of the multilayer conductive patterns to a non-localized heat treatment so that the low melting point conductive layer is broken at every recessed portion.

2. A method of manufacturing a conductive pattern structure as claimed in claim 1, wherein the width of the high melting point conductive layer at each of spaced apart length intervals is less than half width of the high melting point conductive layer at portions thereof extending between the spaced apart intervals.

3. A method of manufacturing a conductive pattern structure as claimed in claim 1, wherein the low melting point conductive layer further includes at least one material selected from the group consisting of Si, Cu, Hf, B, Ti, Pb, Nb, Cr and Sc.

4. A method of manufacturing a conductive pattern structure as claimed in claim 1, wherein the high melting point conductive layer is formed of a high melting point metal alloy.

5. A method of manufacturing a conductive pattern structure as claimed in claim 1, wherein the high melting point conductive layer is formed of a high melting point metal silicide.

6. A method of manufacturing a conductive pattern structure as claimed in claim 1, wherein the length intervals are spaced apart by about 50 to 500 $\mu m$.

7. A method of manufacturing a conductive pattern structure as claimed in claim 1, wherein said forming step comprises the steps of:

forming the high melting point conductive layer on the principal surface of the semiconductor substrate; and forming the low melting point conductive layer on the high melting conductive layer.

8. A method of manufacturing a conductive pattern structure as claimed in claim 1, wherein said forming step comprises the steps of:

forming the low melting point conductive layer on the principal surface of the semiconductor substrate; and forming the high melting point conductive layer on the low melting conductive layer.

9. A method of manufacturing a conductive pattern structure as claimed in claim 1, wherein the length of the recessed portion of the high melting point conductive layer being less than 0.5 $\mu m$.

10. A method of manufacturing a conductive pattern structure for a semiconductor device comprising the steps of:

providing a semiconductor substrate having a principal surface;

forming a plurality of multilayer conductive patterns each having a first layer formed on the principal surface of the semiconductor substrate and a second layer formed on the first layer, one of the first and second layers being formed of high melting point conductive material and having a first width, the other of the first and second layers being formed of low melting point conductive material and having a plurality of first parts and a plurality of second parts located by turns, the first part having the first width and a first length and the second part having a second width which is smaller than the first width and a second length width is smaller than the first length; and subjecting the entirety of the multilayer conductive patterns to a non-localized heat treatment so that said other of the first and second layers is broken at each second parts.

11. A method of manufacturing a conductive pattern structure as claimed in claim 10, wherein the second length is less than 0.5 m.

12. A method of manufacturing a conductive pattern structure as claimed in claim 10, wherein the first length is about 50 to 500 µm.

13. A method of manufacturing a conductive pattern structure as claimed in claim 10, wherein the second width is less than half of the first width.

14. A method of manufacturing a two level conductive pattern structure for a semiconductor device comprising the steps of:

providing a semiconductor substrate having a principal surface;

forming a first level layer on the principal surface of the semiconductor substrate;

forming second level layer on the first layer, wherein one of the first and second layers is formed of high melting point conductive material and has a first width and the other of the first and second layers is formed of low melting point conductive material and has the first width, and wherein the layer formed of the low melting point conductive material has a plurality of narrow portions at length intervals and each of the narrow portions has a second width which is smaller than the first width; and subjecting the entirety of the first and second level layers to a non-localized heat treatment so that the layer formed of the low melting point conductive material is broken at each narrow portions.

15. A method of manufacturing a two level conductive layer structure claimed in claim 14, wherein each of the length of the narrow portions is less than 0.5 mm.

16. A method of manufacturing a two level conductive layer structure claimed in claim 14, wherein the length is about 50 to 500 mm.

17. A method of manufacturing a two level conductive layer structure claimed in claim 14, wherein the second width is less than half of the first width.

* * * * *